United States Patent
Yao et al.

(10) Patent No.: US 9,768,135 B2
(45) Date of Patent: Sep. 19, 2017

(54) SEMICONDUCTOR DEVICE HAVING CONDUCTIVE BUMP WITH IMPROVED RELIABILITY

(71) Applicant: Monolithic Power Systems, Inc., San Jose, CA (US)

(72) Inventors: Ze-Qiang Yao, Santa Clara, CA (US); Fayou Yin, Chengdu (CN); Xiaodan Shang, Chengdu (CN)

(73) Assignee: Monolithic Power Systems, Inc., San Jose (CN)

( * ) Notice: Subject to any disclaimer, the term of this patent is extended or adjusted under 35 U.S.C. 154(b) by 0 days.

(21) Appl. No.: 14/972,049

(22) Filed: Dec. 16, 2015

(65) Prior Publication Data

US 2017/0179059 A1    Jun. 22, 2017

(51) Int. Cl.
*H01L 23/48* (2006.01)
*H01L 23/00* (2006.01)

(52) U.S. Cl.
CPC ............ *H01L 24/13* (2013.01); *H01L 24/11* (2013.01); *H01L 2224/024* (2013.01); *H01L 2224/0239* (2013.01); *H01L 2224/02381* (2013.01); *H01L 2224/13024* (2013.01); *H01L 2224/13082* (2013.01); *H01L 2224/13111* (2013.01); *H01L 2224/13147* (2013.01); *H01L 2924/01029* (2013.01); *H01L 2924/07025* (2013.01)

(58) Field of Classification Search
CPC ....... H01L 24/11; H01L 24/13; H01L 2224/10
USPC ........................................................ 257/737
See application file for complete search history.

(56) References Cited

U.S. PATENT DOCUMENTS

| | | | | |
|---|---|---|---|---|
| 5,404,047 A * | 4/1995 | Rostoker | ............. | G03F 7/70433 257/763 |
| 5,707,894 A * | 1/1998 | Hsiao | ...................... | H01L 24/03 257/E23.02 |
| 5,736,791 A * | 4/1998 | Fujiki | ..................... | H01L 24/03 257/698 |
| 5,902,686 A * | 5/1999 | Mis | ......................... | H01L 24/11 148/528 |
| 5,986,343 A * | 11/1999 | Chittipeddi | ............. | H01L 24/05 257/758 |
| 6,444,295 B1* | 9/2002 | Peng | ....................... | H01L 24/03 257/774 |
| 6,492,197 B1* | 12/2002 | Rinne | ................. | H01L 21/4853 257/737 |
| 6,500,748 B2* | 12/2002 | Anand | .................... | H01L 24/03 257/E23.02 |
| 6,825,541 B2* | 11/2004 | Huang | .................... | H01L 24/13 257/459 |
| 2001/0051426 A1* | 12/2001 | Pozder | .................... | H01L 24/03 438/666 |

* cited by examiner

*Primary Examiner* — Nitin Parekh
(74) *Attorney, Agent, or Firm* — Perkins Coie LLP

(57) ABSTRACT

The present disclosure discloses a semiconductor device having conductive bumps formed on a conductive redistribution layer and associated method for manufacturing. The semiconductor device may further include a first type shallow trench formed on a passivation layer overlying a semiconductor substrate. The conductive redistribution layer is formed in the first type shallow trench. A polyimide layer may be formed between neighboring conductive redistribution layers should a plurality of the conductive redistribution layers are formed with or without the first type shallow trench formed for each of the plurality of conductive redistribution layers.

11 Claims, 9 Drawing Sheets

SEMICONDUCTOR DEVICE HAVING CONDUCTIVE BUMP WITH IMPROVED RELIABILITY

TECHNICAL FIELD

This disclosure relates generally to semiconductor devices, and particularly but not exclusively relates to improving the reliability of metal bumps in the semiconductor devices.

BACKGROUND

It is a significant trend of designing the integrated circuits ("ICs") to have smaller size and increased density. To this end, in terms of packaging the ICs, flip chip packaging approach is more and more popularly used instead of the traditional wire bonding solutions.

In the flip chip packaging approach, conductive bumps (e.g. solder bumps, copper bumps, copper pillar with solder bumps etc.) are used to couple electrical terminals of an IC device to a package lead frame, a package substrate or a circuit board. The IC device may comprise a semiconductor substrate with active or passive circuit elements and connections formed on it, and may generally have tens or hundreds of electrical terminals, either input or output or input and output terminals, for receiving or sending signals or for coupling to power supply connections. Conventionally, a group of the electrical terminals with the similar or the same functions, e.g. the ones needing to be coupled to a power supply, are coupled together to a dedicated pad formed in a top metal layer on the semiconductor substrate. A protective insulting layer, called a passivation layer is then formed to overlie the top metal layer with an opening formed in the passivation layer to expose the dedicated pad for each group of the electrical terminals. Subsequently, a conductive bump may be formed on the passivation layer over the dedicated pad and be connected to the dedicated pad through the opening. In this fashion, a connection route is formed from each group of the electrical terminals having the similar or the same functions to the corresponding conductive bump. However, such a connection route has a significant connection resistance with limited current handling capability and may not be able to meet the practical application requirements, especially in high current applications.

Furthermore, as the size of the IC device continues to fall and the density continues to increase, connecting a group of the electrical terminals with the similar or the same functions to their dedicated pad becomes more and more difficult and the connection routing is complex and hard to design within the top metal layer on the semiconductor substrate, making the design and connection of the electrical terminals inflexible.

In addition, after the conductive bumps for all groups of the electrical terminals are prepared, a thermal reflow process may then be used to make the conductive bumps to at least partially melt and then reflow to complete a mechanical and electrical connection between the integrated circuit and a package lead frame, a package substrate or a circuit board via the conductive bumps. However, since the pitch between different electrical pads of the IC device is decreasing. In consequence, conductive bumps corresponding to the different electrical pads may bridge due to migration of the melted conductive bumps during the thermal reflow process, causing electrical shorts.

Moreover, delamination of a molding compound, generally formed to wrap and mold the package, from die surface may occur when the IC device operates under certain extreme operating conditions, especially under high temperature and high humidity conditions, which may also leading to failure of the IC device when operating in such extreme operating conditions.

A need therefore exists in reducing the interconnection resistance and improving the current handling ability, quality and reliability of a semiconductor device using conductive bumps and requiring size reduction.

SUMMARY

In view of the above requirements, there has been provided, in accordance with an embodiment of the present disclosure, a semiconductor device. The semiconductor device may have at least one electrical terminal on a semiconductor substrate and a passivation layer overlying the semiconductor substrate. A first type shallow trench can be formed in an upper portion of the passivation layer with a predetermined trench depth and exposing a lower portion of the passivation layer corresponding to the upper portion. A plurality of vias are located in the lower portion of the passivation layer to expose a plurality of portions of the at least one electrical terminal. A conductive redistribution layer is formed in the first type shallow trench, filling the plurality of vias and overlying a portion of the lower portion of the passivation layer and at least one conductive bump can be formed on a selected portion of the conductive redistribution layer. The at least one conductive bump is connected to the at least one electrical terminal through the plurality of vias.

There has also been provided, in accordance with an embodiment of the present disclosure, a semiconductor device. The semiconductor device may have at least one electrical terminal on a semiconductor substrate and a passivation layer overlying the semiconductor substrate. A plurality of first type shallow trenches are formed in an upper portion of the passivation layer with each of the plurality of first type shallow trenches having a predetermined trench depth. A conductive redistribution layer is formed in each of the plurality of first type shallow trenches; and at least one conductive bump can be formed on a selected portion of the conductive redistribution layer in at least one of the plurality of first type shallow trenches over the at least one electrical terminal. The at least one conductive bump is connected to the at least one electrical terminal through a plurality of vias formed in the passivation layer.

In addition, there has been provided, in accordance with an embodiment of the present disclosure, a method of forming a semiconductor device. The method may comprise: forming a passivation layer over a semiconductor substrate; forming a first type shallow trench extended from a top surface of the passivation layer into an upper portion of the passivation layer with a predetermined trench depth to expose a lower portion of the passivation layer corresponding to the upper portion; forming a plurality of vias in the lower portion of the passivation layer; forming a conductive redistribution layer in the first type shallow trench, filling the plurality of vias and overlying a portion of the lower portion of the passivation layer; and forming at least one conductive bump on a selected portion of the conductive redistribution layer.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down," "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
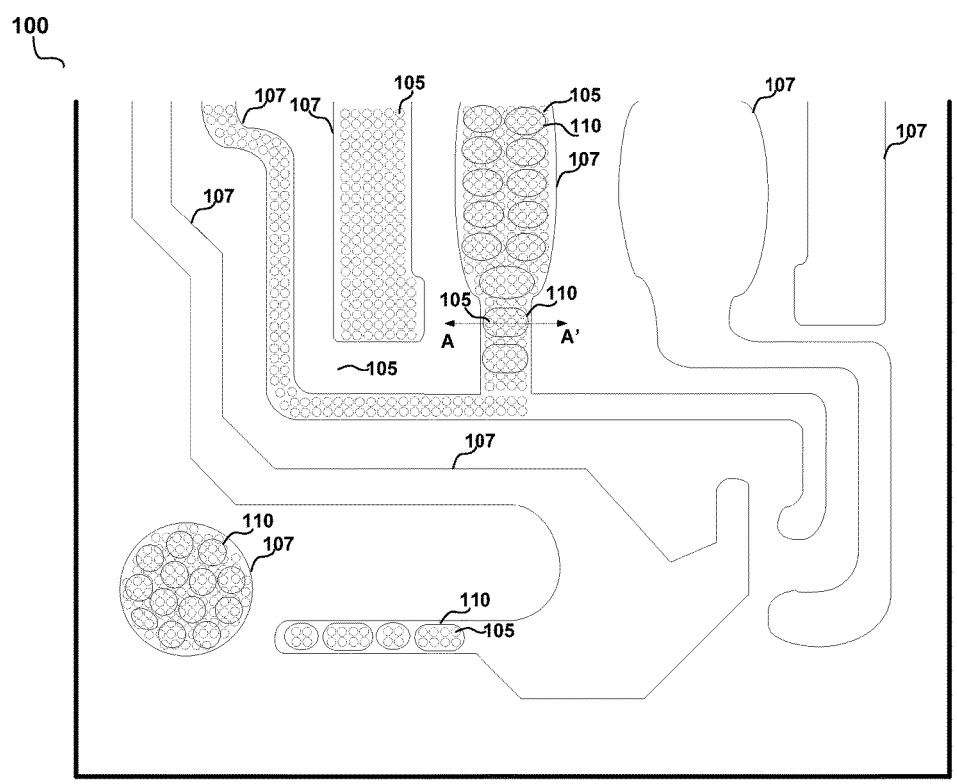
FIG. 1 illustrates schematically a top plan view of a portion of a semiconductor device 100 in accordance with an embodiment of the present invention.
Figure 2:
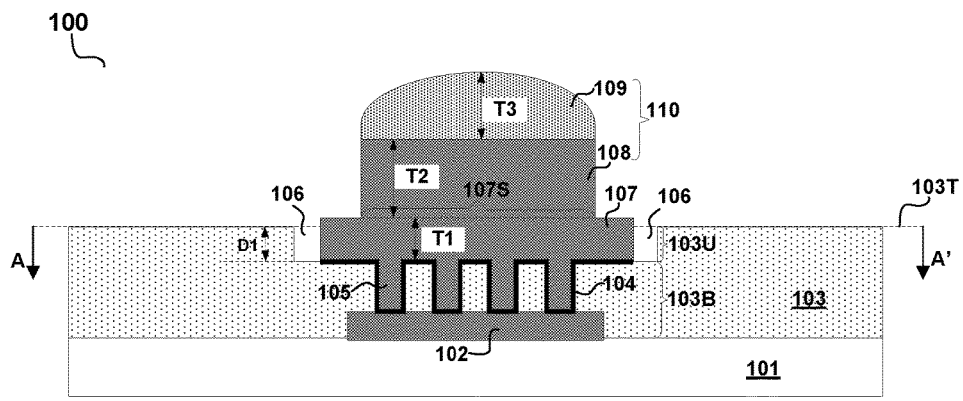
FIG. 2 illustrates schematically a cross-sectional view of a portion of the semiconductor device 100 cut from the line AA' in the top plan view of FIG. 1 in accordance with an embodiment of the present invention.

FIG. 1 illustrates schematically a top plan view of a portion of a semiconductor device 100 in accordance with an embodiment of the present invention. FIG. 2 illustrates schematically a cross-sectional view of a portion of the semiconductor device 100 cut from the line AA' in the top plan view of FIG. 1 in accordance with an embodiment of the present invention. However, it should be understood that the corresponding relationship provided herein between the cross-sectional view and the top plan view of the semiconductor device 100 illustrated in FIG. 1 and FIG. 2 is not intended to be limiting.

An exemplary embodiment of the present invention will be described with reference to FIG. 1 and FIG. 2, the semiconductor device 100 which is undergoing flip chip packaging may comprise a semiconductor substrate 101 (see FIG. 2). Integrated circuits including active and passive circuit elements may be manufactured in the semiconductor substrate 101. The active and passive circuit elements may include transistors (e.g., metal oxide semiconductor field effect transistors ("MOSFET"), bipolar junction transistors ("BJT"), junction field effect transistors ("JFET"), isolated gate bipolar transistors ("IGBT"), double diffusion metal oxide semiconductor transistors ("DMOS"), etc.), resistors, diodes, capacitors, inductors, current source, voltage source, fuses and other suitable elements. The circuit elements are interconnected to form the integrated circuits, such as logic circuits, power conversion circuits, memory devices (e.g. random-access memory ("RAM"), static random-access memory ("SRAM"), etc.), input/output devices, system on chip ("SoC") devices and/or other suitable devices. The semiconductor substrate 101 may refer to a substrate comprising semiconductor materials, including but not limited to, bulk silicon, doped silicon, Silicon-Germanium (SiGe), Silicon on insulator (SOI), and/or any other suitable semiconductor materials. Other suitable semiconductor materials may include group III, group IV, and group V elements.

In the semiconductor substrate 101, isolation structures may also be formed to define and isolate the various circuit elements formed in the semiconductor substrate 101. The semiconductor substrate 101 may further comprise interlayer dielectric layers and a metallization layer (or multi-metallization layers) overlying the integrated circuits formed in the semiconductor substrate 101. The metallization layer or multi-metallization layers may be patterned to form a plurality of electrical terminals (e.g. the exemplary electrical terminal 102 illustrated in FIGS. 2~6L) that can be coupled to various circuit elements and/or connection nodes in the integrated circuits, so that the circuit elements and/or connection nodes can receive or send signals or be coupled to power supply connections or to ground etc. Each of the plurality of electrical terminals may have an exposed surface treated by a planarization process, such as chemical mechanical polishing, if necessary. Materials suitable for forming the metallization layer or multi-metallization layers to be patterned to the electrical terminals may include aluminum, copper, silver, gold, nickel, or tungsten or combinations thereof. For the sake of simplicity, a single electrical terminal 102 is illustrated in the drawings of FIGS. 2~6L. But it should be understood that the illustration and description in this disclosure is not intended to be limiting and exclusive. One of ordinary skilled in the art may understand that tens or hundreds or thousands of electrical terminals may be formed on the semiconductor substrate 101.

The semiconductor substrate 101 with the integrated circuits and electrical terminals formed may then undergo flip chip packaging processes, during which the semiconductor substrate 101 can be mounted or attached to a package lead frame, a package substrate or a circuit board etc., with the electrical terminals being coupled to corresponding contacting sites or corresponding leads located on the package lead frame, the package substrate or the circuit board. Conductive bumps may be manufactured to fulfill the coupling of the electrical terminals to the package lead frame, the package substrate or the circuit board.

Still referring to the exemplary embodiment shown in FIG. 1 and FIG. 2, in accordance with an embodiment of the present invention, the semiconductor device 100 using conductive bumps during flip chip packaging may further comprise a protective insulating layer, also called a passivation layer 103 (referring to FIG. 2), overlying the semiconductor substrate 101. Vias 105 may be formed in the passivation layer 103 to expose portions of each of the electrical terminals 102 so that the electrical terminals 102 can be connected out afterwards (see FIG. 1 and FIG. 2). The tens or hundreds or thousands of electrical terminals 102 formed on the semiconductor substrate 101 may be grouped by functions. For example, the electrical terminals having the similar or the same functions, e.g. the ones needing to receive the same signal, or to provide the same signal, or to be coupled to the same outside lead/terminal, are grouped together. For each group of the electrical terminals 102, a conductive redistribution layer 107 may be formed on the passivation layer 103 to fill all the vias 105 over the electrical terminals 102 and overlie a portion of the passivation layer 103 that is over each group of the electrical terminals 102 (referring to the top plan view of FIG. 1). In this way, each group of the electrical terminals 102 are coupled together by the conductive redistribution layer 107 running over them. Then conductive bumps (at least one conductive bump) 110 may be formed on a selected portion 107S of the conductive redistribution layer 107 over each group of the electrical terminals 102 so that the at least one conductive bump 110 is connected to at least one of the electrical terminals 102 through the vias 105. One of ordinary skill in the art should understand that not all of the electrical terminals 102 having the similar or the same functions should be grouped just in one group, but they can be grouped in a plurality of smaller groups depending on how close to each other they are located. With the scheme disclosed herein in accordance with this exemplary embodiment, the tens or hundreds or thousands of electrical terminals 102 can be more flexibly designed in location, with the connection resistance from the electrical terminals 102 to the conductive bumps 110 reduced and the current handling capability improved.

In accordance with an exemplary embodiment, the conductive redistribution layer 107 may comprise copper (Cu) and may have a first thickness T1, which may be designed according to practical application requirements. In one embodiment, the first thickness T1 may be of 1 μm~30 μm. In another embodiment, the first thickness T1 may be of 5 μm~15 μm.

In accordance with an exemplary embodiment, each of the conductive bump 110 may comprise a conductive pillar layer 108 formed on the conductive redistribution layer 107 and a conductive solderable layer 109 formed on the conductive pillar layer 108. The conductive pillar layer 108 may comprise copper and may have a second thickness T2. In one embodiment, the second thickness T2 may be of 10 μm~100 μm. In another embodiment, the second thickness T2 may be of 40 μm~65 μm. The conductive solderable layer 109 may comprise tin (Sn) or tin silver (SnAg) and may have a third thickness T3. In one embodiment, the third thickness T3 may be of 10 μm~50 μm. In another embodiment, the third thickness T3 may be of 25 μm~50 μm. The conductive bump 110 may have a height (T2+T3) of 25 μm~115 μm. One of ordinary skill in the art should understand that the ranges for the thicknesses and height are only examples, not intended to limit the invention.

In accordance with an exemplary embodiment of the present application, after the conductive bumps 110 for all groups of the electrical terminals 102 are prepared, a thermal reflow process may then be applied to make the conductive bumps 110 to at least partially melt and then reflow to complete a mechanical and electrical connection between the semiconductor device 100 and a package lead frame, a package substrate or a circuit board for receiving the semiconductor device 100. However, since the pitch between different conductive redistribution layers 107 of the semiconductor device 100 is decreasing. The neighboring conductive redistribution layers 107 corresponding to different groups of the electrical terminals 102 may bridge due to migration of the conductive redistribution layers or conductive bumps 110 during the thermal reflow process, or electrical field difference induced migration during semiconductor device operations causing electrical shorts. Moreover, delamination of a molding compound from the passivation layer 103 may occur when the semiconductor device 100 operates under certain extreme operating conditions, especially under high temperature and high humidity conditions, which may also leading to failure of the semiconductor device 100 when operating in such extreme operating conditions. The molding compound may generally be formed to wrap and mold the package.

In accordance with an exemplary embodiment of the present invention, the semiconductor device 100 may further comprise a first type shallow trench 106 that can be formed in an upper portion 103U of the passivation layer 103 over each group of the electrical terminals 102 before forming the conductive redistribution layer 107 (referring to FIG. 2). A lower portion 103B of the passivation layer 103 corresponding to the upper portion 103U is then exposed by the first type shallow trench 106. The first type shallow trench 106 may have a predetermined trench depth D1 measured from a top surface 103T of the passivation layer 103. Although in the cross sectional view of FIG. 2, only one first type shallow trench 106 is illustrated out. Actually, a plurality of first type shallow trenches 106 may be formed, each corresponding to a conductive redistribution layer 107 for connecting the electrical terminals 102 in one of the groups of the electrical terminals 102 together. Thus, in such an exemplary embodiment where the first type shallow trenches 106 are formed, each of the conductive redistribution layers 107 is formed in a corresponding first type shallow trench 106, filling the plurality of vias 105 and overlying a portion of the lower portion 103B of the passivation layer 103 in that corresponding first type shallow trench 106 (refer to the illustration of FIG. 2). That means each of the plurality of first type shallow trenches 106 may have a trench width W1 larger than a width W2 of the corresponding conductive redistribution layer 107 formed therein. And thus a gap may be formed between each conductive redistribution layer 107 and a wall of the corresponding first type shallow trench 106 so as to better separate the conductive redistribution layers 107 from each other. For the sake of simplicity, one of ordinary skill in the art should understand that the plurality of first type shallow trenches 106 are not illustrated out in the top plan view of FIG. 1.

With the first type shallow trenches 106 formed and each of the conductive redistribution layers 107 located inside a corresponding shallow trench 106, the neighboring conductive redistribution layers 107 corresponding to different groups of the electrical terminals 102 are better separated from each other to prevent migration of the melted conductive bumps 110 during the thermal reflow process or electrical field difference induced migration during semiconductor device operations, reducing the possibility of electrical shorts between different groups of the electrical terminals 102. Furthermore, delamination between the molding compound formed to wrap and mold the package and the passivation layer 103 can be prevented or at least reduced even if the semiconductor device 100 operates under certain extreme operating conditions, e.g. under high temperature and high humidity conditions. Thus, the reliability and quality of the semiconductor device 100 may be significantly improved.

Figure 3:
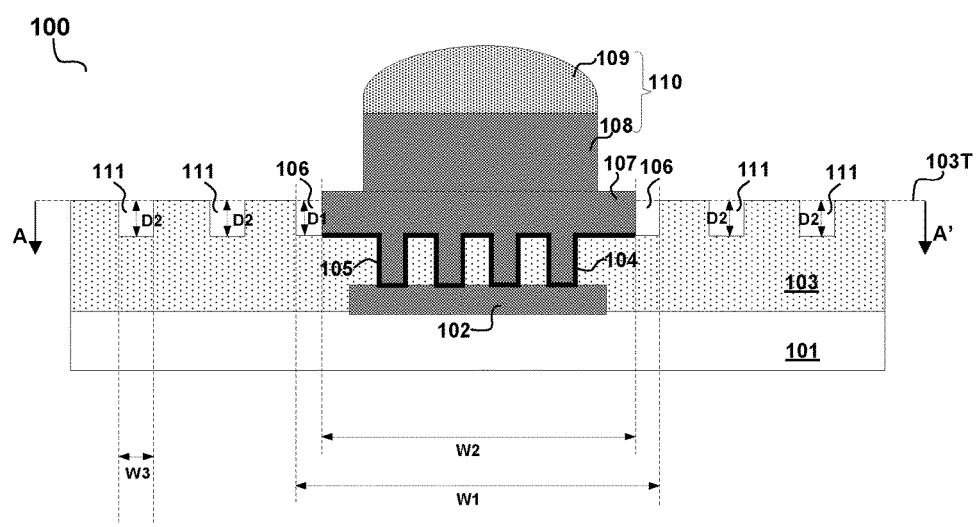
FIG. 3 illustrates schematically a cross-sectional view of a portion of the semiconductor device 100 cut from the line AA' in the top plan view of FIG. 1 in accordance with an alternative embodiment of the present invention.

FIG. 3 illustrates schematically a cross-sectional view of a portion of the semiconductor device 100 cut from the line AA' in the top plan view of FIG. 1 in accordance with an alternative embodiment of the present invention. In the exemplary embodiment of FIG. 3, the semiconductor device 100 may further comprise a plurality of second type shallow trenches 111 formed in the passivation layer 103 outside each of the plurality of first type shallow trenches 106, e.g. between every two adjacent first type shallow trenches 106 among the plurality of first type shallow trenches 106. Each of the plurality of second type shallow trenches 111 may have a smaller trench width W3 than that (W1) of the first type shallow trench 106.

With the second type shallow trenches 111 formed, migration of melted conductive bumps 110 during the thermal reflow process can be further prevented, reducing the possibility of electrical shorts between different groups of the electrical terminals 102. Delamination between the molding compound and the passivation layer 103 can also be further prevented or at least further reduced even if the semiconductor device 100 operates under certain extreme operating conditions. Thus, the reliability and quality of the semiconductor device 100 may be further improved compared to the exemplary embodiment illustrated in FIG. 2.

Figure 4:
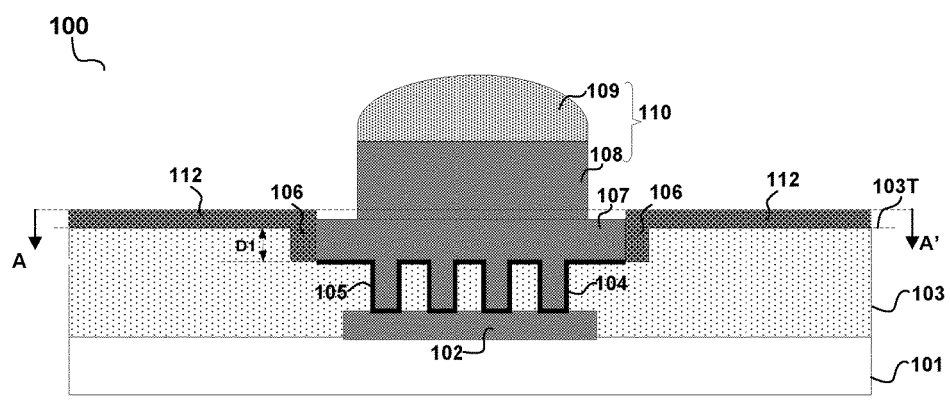
FIG. 4 illustrates schematically a cross-sectional view of a portion of the semiconductor device 100 cut from the line AA' in the top plan view of FIG. 1 in accordance with another alternative embodiment of the present invention.

FIG. 4 illustrates schematically a cross-sectional view of a portion of the semiconductor device 100 cut from the line AA' in the top plan view of FIG. 1 in accordance with another alternative embodiment of the present invention. According to the exemplary embodiment shown in FIG. 4, the semiconductor device 100 may further comprise a polyimide layer 112 formed on the passivation layer 103 filling a space between every two adjacent conductive redistribution layers 107, including filling the gap between each conductive redistribution layer 107 and the wall of the corresponding first type shallow trench 106, and filling the plurality of second type shallow trenches 111 should there be any formed. The polyimide layer 112 may help to isolate the adjacent conductive redistribution layers 107 and further improve the reliability of the semiconductor device 100.

Figure 5:
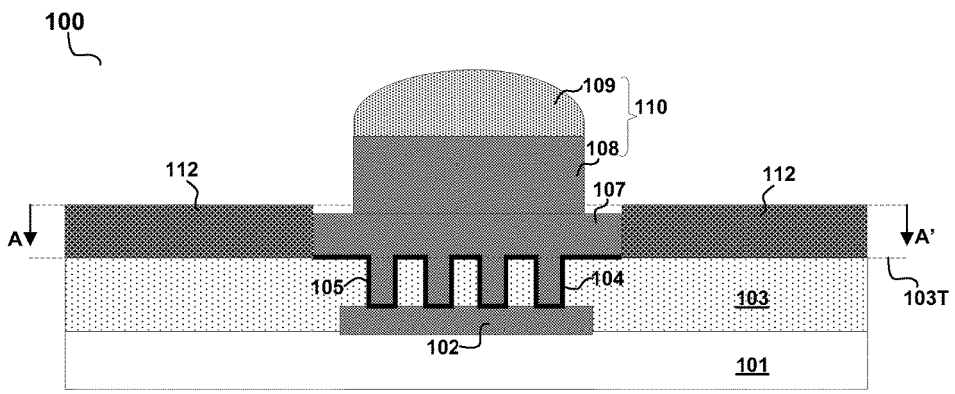
FIG. 5 illustrates schematically a cross-sectional view of a portion of the semiconductor device 100 cut from the line AA' in the top plan view of FIG. 1 in accordance with still another alternative embodiment of the present invention.

In accordance with an alternative embodiment of the present invention, as shown in FIG. 5, with the polyimide layer 112 formed, the first type shallow trenches 106 may not necessarily needing to be formed. Similarly, the second type shallow trenches 111 are optional too. In that case, the polyimide layer 112 is formed on the passivation layer 103 between every two adjacent conductive redistribution layers 107 (i.e. filling a space between every two adjacent conductive redistribution layers 107), providing isolation, preventing electrical shorts between different groups of the electrical terminals 102 due to migration of the melted conductive bumps 110 during the thermal reflow process, reducing the possibility of delamination of a molding compound and enhancing the reliability of the semiconductor device 100.

The advantages of the various embodiments of the semiconductor device (e.g. the semiconductor device 100) having conductive bumps (e.g. bumps 110) formed on conductive redistribution layers (e.g. the plurality of redistribution layers 107) of the present invention are not confined to those described above. These and other advantages of the various embodiments of the present invention will become more apparent upon reading the whole detailed descriptions and studying the various figures of the drawings.

FIGS. 6A through 6L are cross-sectional views illustrating schematically a method for forming a semiconductor device (e.g. the semiconductor device 100) having conductive bumps (e.g. bumps 110) formed on conductive redistribution layers (e.g. the plurality of redistribution layers 107) in accordance with an exemplary embodiment of the present invention.

Figure 6A:
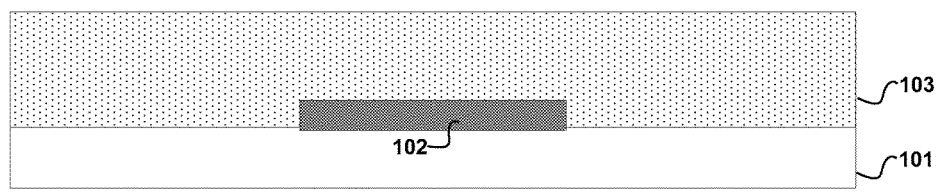
FIGS. 6A through 6L are cross-sectional views illustrating schematically a method for forming a semiconductor device 100 having conductive bump in accordance with an exemplary embodiment of the present invention.

Referring to FIG. 6A, a semiconductor substrate 101 with integrated circuits formed therein and a plurality of (e.g. tens or hundreds or thousands of) electrical terminals 102 formed thereon for coupling the integrated circuits out is provided. The plurality of electrical terminals 102 formed may be grouped by functions. It should be understood that the cross sectional views in FIGS. 6A-6L illustrate only portions of the semiconductor device 100. For instance, the sectional view in each of these figures can be considered as corresponding to the portion cut from the cut line AA' in the top plan view of FIG. 1 for better understanding. Then a passivation layer 103 is formed over the semiconductor substrate 101. The passivation layer 103 is a protective insulting layer.

Figure 6B:
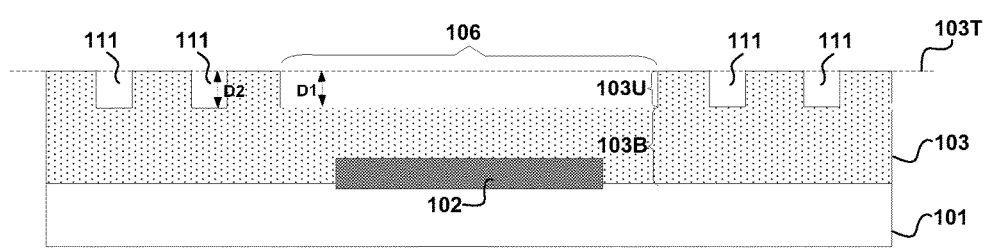

Subsequently, referring to FIG. 6B, a first type shallow trench 106 is formed in an upper portion 103U of the passivation layer 103 over each group of the electrical terminals 102. The first type shallow trench 106 is extended from a top surface 103T of the passivation layer 103 into the upper portion 103U with a predetermined trench depth D1 to expose a lower portion 103B of the passivation layer 103 corresponding to the upper portion 103U. Although only one first type shallow trench 106 is illustrated out. Actually, a plurality of first type shallow trenches 106 may be formed, each corresponding to one group of the electrical terminals 102.

In accordance with an embodiment of the present invention, a plurality of second type shallow trenches 111 may also be formed in the same process as the first type shallow trench 106 is formed. The plurality of second type shallow trenches 111 are formed in the passivation layer 103 outside the first type shallow trench 106, e.g. between every two adjacent first type shallow trenches 106 among the plurality of first type shallow trenches 106. Each of the plurality of second type shallow trenches 111 may have a smaller trench width than the first type shallow trench 106, and may have a trench depth D2 the same as the predetermined trench depth D1 of the first type shallow trench 106. Of course, in other embodiment, the trench depth D2 may be different from the trench depth D1. Optionally, the plurality of second type shallow trenches 111 may not be formed in the same process as the first type shallow trench 106 is formed.

Figure 6C:
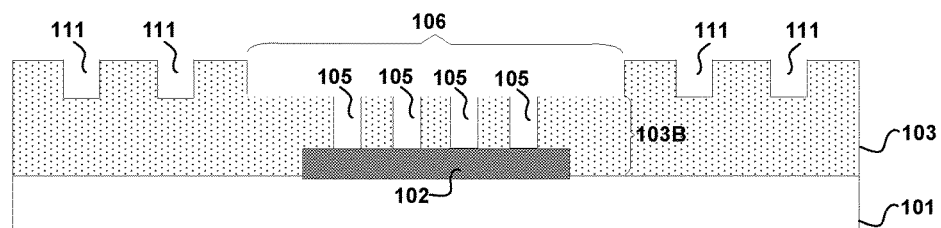

Subsequently, referring to FIG. 6C, a plurality of vias 105 are formed in the lower portion 103B of the passivation layer 103 exposed by each of the plurality of first type shallow trenches 106. The vias 105 extend all the way through the lower portion 103B to expose portions of each of the electrical terminals 102.

Figure 6D:
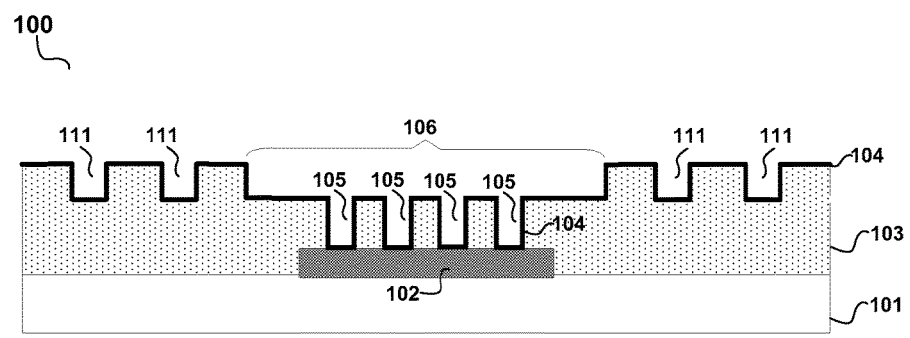

Subsequently, referring to FIG. 6D, a conductive under bump metallization layer 104 is formed lining the plurality of first type shallow trenches 106, the plurality of second type shallow trenches 111 (if formed) and the plurality of vias 105. The conductive under bump metallization layer 104 may be a seed layer formed through sputtering conductive materials, such as copper or titanium or copper and titanium. This conductive under bump metallization layer 104 may be used to provide an electricity conduction path so that a conductive redistribution layer can be formed later on.

Figure 6E:
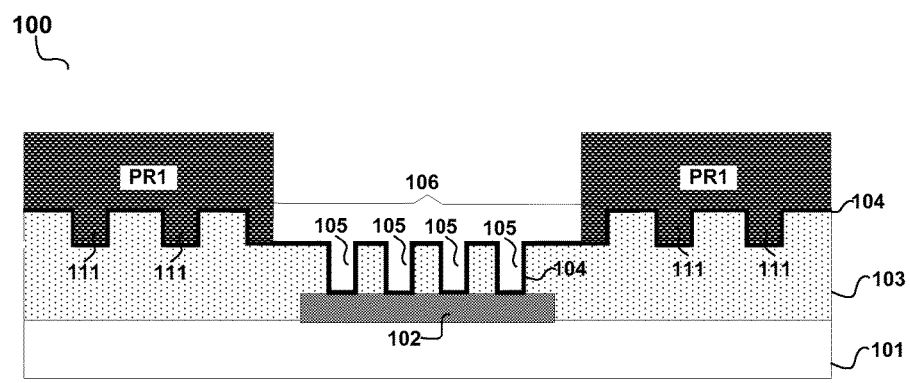

Subsequently, referring to FIG. 6E, a first photo resist layer PR1 is formed and patterned to expose a portion of the lower portion 1036 of the passivation layer 103 in each of the plurality of first type shallow trenches 106.

Figure 6F:
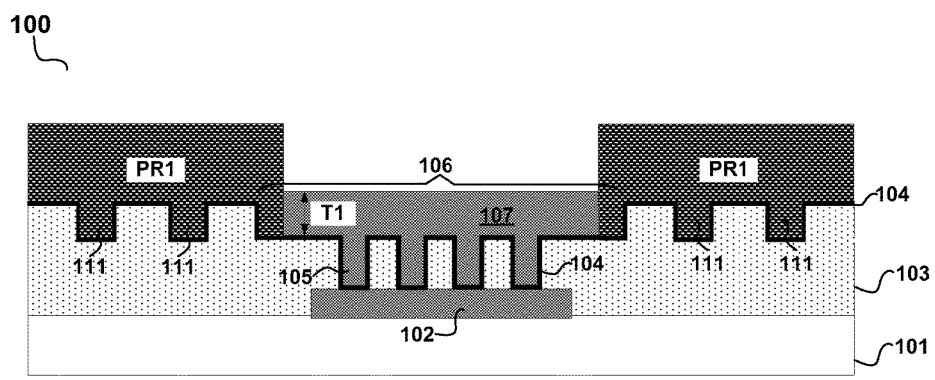

In subsequence, referring to FIG. 6F, a conductive redistribution layer 107 is formed on the exposed portion of the lower portion 103B in each of the first type shallow trenches 106, filling the plurality of vias 105. The conductive redistribution layer 107 may be formed to a first thickness T1. In one embodiment, the first thickness T1 may be of 1 μm~30 μm. In another embodiment, the first thickness T1 may be of 5 μm~10 μm.

In the following, the first photo resist layer PR1 is removed, referring to FIG. 6G. A gap may appear between each conductive redistribution layer 107 and a wall of the corresponding first type shallow trench 106.

Figure 6G:
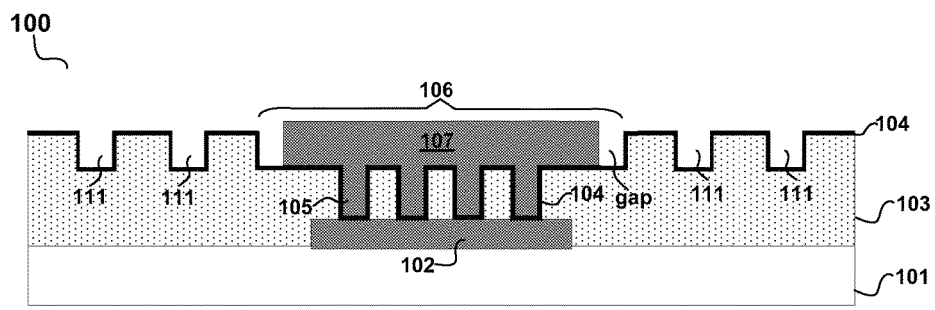
Figure 6H:
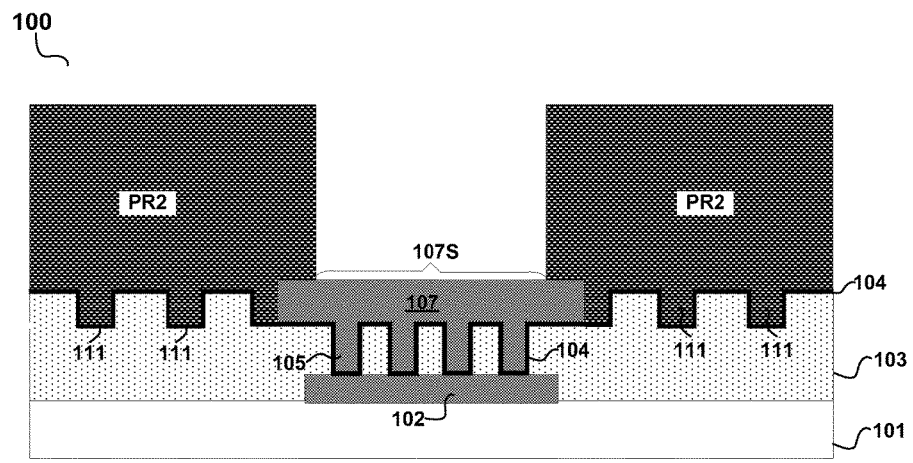

Then, referring to FIG. 6H, a second photo resist layer PR2 may then be formed and patterned to expose a selected portion (or a plurality of selected portions) 107S of the conductive redistribution layer 107. One of ordinary skill in the art should understand that the selected portion or the plurality of selected portions 107S may be selected depending on where conductive bump/bumps are needing to be formed.

Figure 6I:
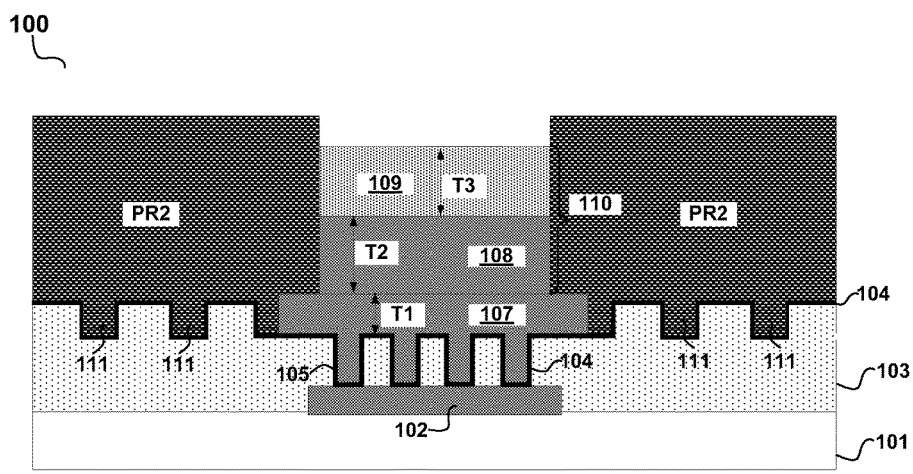

Subsequently, referring to FIG. 6I, a conductive bump 110 is formed on the selected portion 107S or on each of the plurality of selected portions 107S of the conductive redistribution layer 107. Forming the conductive bump 110 may comprise: forming a conductive pillar layer 108 and then forming a conductive solderable layer 109 on the conductive pillar layer 108. In an embodiment, the conductive pillar layer 108 may comprise copper and may have a second thickness T2. In one embodiment, the second thickness T2 may be of 15 μm~65 μm. In another embodiment, the second thickness T2 may be of 40 μm~65 μm. The conductive solderable layer 109 may comprise tin (Sn) or tin silver (SnAg) and may have a third thickness T3. In one embodiment, the third thickness T3 may be of 10 μm~50 μm. In another embodiment, the third thickness T3 may be of 25 μm~50 μm. The conductive bump 110 may have a height (T2+T3) of 25 μm~115 μm. One of ordinary skill in the art should understand that the ranges for the thicknesses and height are only examples, not intended to limit the invention.

Figure 6J:
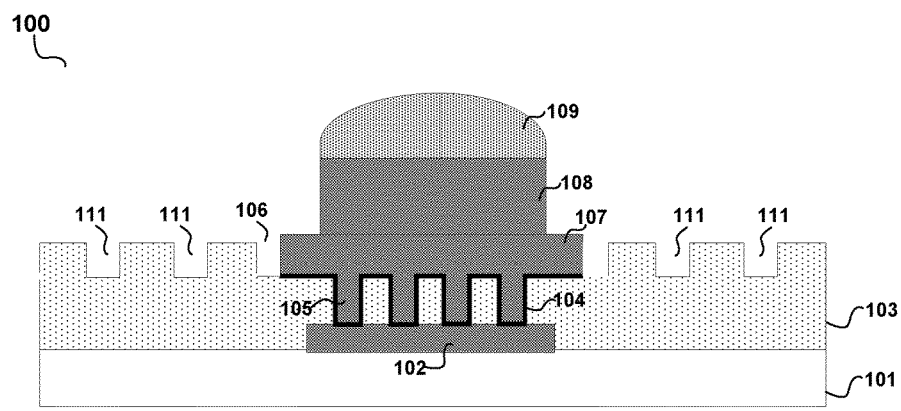

Subsequently, referring to FIG. 6J, the second photo resist layer PR2 is removed. Then, exposed portions of the conductive under bump metallization layer 104 are removed too, obtaining the semiconductor device 100 having the structure shown in FIG. 2 or FIG. 3, ready to be flip-chip mounted on or attached to a package lead frame, a package substrate or a circuit board etc.

Figure 6K:
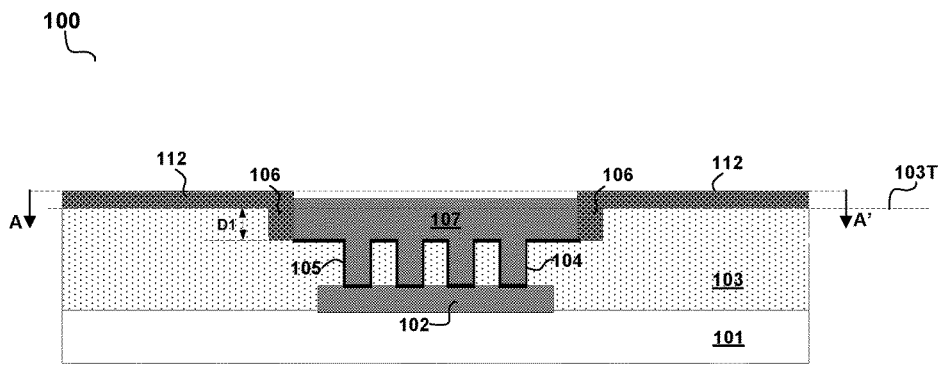
Figure 6L:
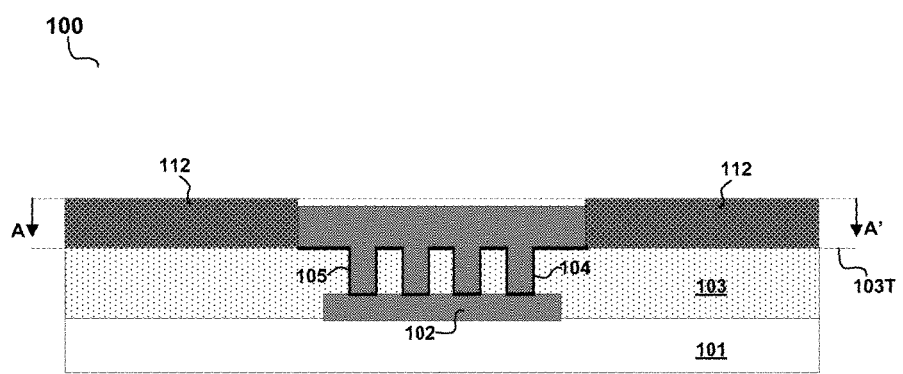

In accordance with an alternative embodiment of the present invention, referring back to the step illustrated in FIG. 6G, after the conductive redistribution layers 107 are formed, a polyimide layer 112 may be formed on the passivation layer 103, as shown in FIG. 6K. The polyimide layer 112 may be formed to fill a space between every two adjacent conductive redistribution layers 107, including filling the gap between each conductive redistribution layer 107 and the wall of the corresponding first type shallow trench 106, and filling the plurality of second type shallow trenches 111 should there be any formed. In this alternative embodiment, after the step illustrated in FIG. 6K, the steps illustrated in FIGS. 6H~6J may be performed, and the semiconductor device 100 having the structure shown in FIG. 4 may be obtained.

In accordance with an alternative embodiment of the present invention, with the polyimide layer 112 formed, the first type shallow trenches 106 may not necessarily needing to be formed. Similarly, the second type shallow trenches 111 are optional too. In that case, referring back to the step illustrated in FIG. 6A, after the formation of the passivation layer 103, a plurality of vias 105 may be formed over each of the plurality of electrical terminals 102, referring to the vias formation step as has been described with reference to FIG. 6C. Then the steps illustrated and described with reference to FIGS. 6D~6G may be performed to form a plurality of conductive redistribution layers 107, with each of the plurality of conductive redistribution layers 107 formed over one of the groups of the plurality of electrical terminals 102. The difference of performing the steps illustrated in FIGS. 6D~6G for this alternative embodiment from the exemplary embodiment described above may only lie in that the plurality of first type shallow trenches 106 and/or the plurality of the second type shallow trenches 111 are not formed. Subsequently, referring to FIG. 6L, the polyimide layer 112 may be formed on the passivation layer 103 between every two adjacent conductive redistribution layers 107 (i.e. filling a space between every two adjacent conductive redistribution layers 107). Then, after the step illustrated in FIG. 6L, the steps illustrated in FIGS. 6H~6J may be performed, and the semiconductor device 100 having the structure shown in FIG. 5 may be obtained.

Methods and processes of forming a semiconductor device 100 having conductive bumps (e.g. bumps 110) formed on conductive redistribution layers (e.g. the plurality of redistribution layers 107) described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the invention is not limited except as by the appended claims.

We claim:

1. A semiconductor device, comprising:
 a semiconductor substrate having at least one electrical terminal on the semiconductor substrate;
 a passivation layer overlying the semiconductor substrate;
 a first type shallow trench formed in an upper portion of the passivation layer with a predetermined trench depth and exposing a lower portion of the passivation layer corresponding to the upper portion;
 a plurality of vias formed in the lower portion of the passivation layer to expose a plurality of portions of the at least one electrical terminal;
 a conductive redistribution layer formed in the first type shallow trench, filling the plurality of vias and overlying a portion of the lower portion of the passivation layer;

at least one conductive bump formed on a selected portion of the conductive redistribution layer and connected to the at least one electrical terminal through the plurality of vias; and a plurality of second type shallow trenches formed in the passivation layer outside the first type shallow trench;

each of the plurality of second type shallow trenches has a smaller trench width than that of the first type shallow trench.

2. The semiconductor device of claim 1, wherein:

each of the plurality of second type shallow trenches has substantially the same predetermined trench depth as the first type shallow trench.

3. The semiconductor device of claim 1, further comprising:

an under bump metallization layer lining the passivation layer directly below the conductive redistribution layer and lining the plurality of vias.

4. The semiconductor device of claim 1, wherein the at least one conductive bump comprises:

a conductive pillar layer formed on the selected portion of the conductive redistribution layer; and a conductive solderable layer formed on the conductive pillar layer.

5. The semiconductor device of claim 4, wherein the conductive pillar layer comprises copper.

6. The semiconductor device of claim 5, wherein the conductive solderable layer comprises tin or tin silver.

7. The semiconductor device of claim 1, wherein the conductive redistribution layer comprises copper.

8. The semiconductor device of claim 1, wherein the conductive redistribution layer is separated from a wall of the first type shallow trench with a gap.

9. A semiconductor device, comprising:

a semiconductor substrate having at least one electrical terminal on the semiconductor substrate;

a passivation layer overlying the semiconductor substrate;

a first type shallow trench formed in an upper portion of the passivation layer with a predetermined trench depth and exposing a lower portion of the passivation layer corresponding to the upper portion;

a plurality of vias formed in the lower portion of the passivation layer to expose a plurality of portions of the at least one electrical terminal;

a conductive redistribution layer formed in the first type shallow trench, filling the plurality of vias and overlying a portion of the lower portion of the passivation layer, wherein the conductive redistribution layer is separated from a wall of the first type shallow trench with a gap;

at least one conductive bump formed on a selected portion of the conductive redistribution layer and connected to the at least one electrical terminal through the plurality of vias; and a polyimide layer filling the gap between the conductive redistribution layer and the wall of the first type shallow trench.

10. A semiconductor device, comprising:

a semiconductor substrate having at least one electrical terminal on the semiconductor substrate;

a passivation layer overlying the semiconductor substrate;

a plurality of first type shallow trenches formed in an upper portion of the passivation layer with each of the plurality of first type shallow trenches having a predetermined trench depth;

a conductive redistribution layer formed in each of the plurality of first type shallow trenches;

at least one conductive bump formed on a selected portion of the conductive redistribution layer in at least one of the plurality of first type shallow trenches over the at least one electrical terminal, wherein the at least one conductive bump is connected to the at least one electrical terminal through a plurality of vias formed in the passivation layer; and a plurality of second type shallow trenches formed in the passivation layer between every two adjacent first type shallow trenches among the plurality of first type shallow trenches;

each of the plurality of second type shallow trenches has a smaller trench width than that of the first type shallow trench.

11. The semiconductor device of claim 10, further comprising:

a polyimide layer filling a space between every two adjacent conductive redistribution layers.

* * * * *